(12) United States Patent
Komatsu et al.

(10) Patent No.: US 12,484,141 B2
(45) Date of Patent: Nov. 25, 2025

(54) ELECTRONIC CIRCUIT MODULE

(71) Applicant: Murata Manufacturing Co., Ltd., Kyoto (JP)

(72) Inventors: Toru Komatsu, Nagaokakyo (JP); Tadashi Nomura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 217 days.

(21) Appl. No.: 18/458,270

(22) Filed: Aug. 30, 2023

(65) Prior Publication Data

US 2023/0413418 A1 Dec. 21, 2023

Related U.S. Application Data

(63) Continuation of application No. PCT/JP2021/039525, filed on Oct. 26, 2021.

(30) Foreign Application Priority Data

Mar. 24, 2021 (JP) .................................. 2021-050561

(51) Int. Cl.
*H05K 1/02* (2006.01)
*H05K 1/18* (2006.01)

(52) U.S. Cl.
CPC ......... *H05K 1/0204* (2013.01); *H05K 1/0209* (2013.01); *H05K 1/0266* (2013.01);
(Continued)

(58) Field of Classification Search
CPC ..... H05K 1/0204–0212; H05K 1/0266; H05K 1/181; H05K 2201/0212;
(Continued)

(56) References Cited

U.S. PATENT DOCUMENTS

2009/0026636 A1* 1/2009 Murai ................. H01L 23/5389
257/E21.585
2011/0037147 A1* 2/2011 Watanabe ............. H01L 23/544
257/E23.179
(Continued)

FOREIGN PATENT DOCUMENTS

JP H09-180973 A 7/1997
JP 2018-195756 A 12/2018

OTHER PUBLICATIONS

International Search Report for PCT/JP2021/039525 dated Dec. 28, 2021.

*Primary Examiner* — Amir A Jalali
(74) *Attorney, Agent, or Firm* — McDonald Hopkins LLC (57) ABSTRACT

To provide electronic circuit module capable of dissipating heat generated by electronic component while suppressing increase in thickness, and capable of improving identifiability and visibility of identification character and identification mark as compared with conventional technique. Electronic circuit module according to present disclosure includes board, plurality of electronic components mounted on upper surface of board; and sealing resin configured to cover electronic component. Sealing resin has lower surface in contact with upper surface of board, and upper surface positioned on opposite side from board with respect to electronic component to face in opposite direction from lower surface. Identification recess constituting at least one of identification character and identification mark when viewed from thickness direction of board is formed in upper surface of sealing resin. Identification recess is filled with filler made of material having higher thermal conductivity than material of sealing resin.

18 Claims, 9 Drawing Sheets

(52) U.S. Cl.
CPC ..... *H05K 1/181* (2013.01); *H05K 2201/0212* (2013.01); *H05K 2201/0715* (2013.01)

(58) Field of Classification Search
CPC .......... H05K 2201/0715; H01L 23/295; H01L 23/3128; H01L 23/3135; H01L 23/544; H01L 25/00; H01L 25/16; H01L 21/561; H01L 21/565
See application file for complete search history.

(56) References Cited

U.S. PATENT DOCUMENTS

| | | | | |
|---|---|---|---|---|
| 2020/0105679 A1* | 4/2020 | Bae | .......................... | H01L 24/20 |
| 2020/0111742 A1* | 4/2020 | Han | .................... | H01L 23/3128 |
| 2020/0375022 A1* | 11/2020 | Nomura | .................. | H01L 25/18 |
| 2022/0020697 A1* | 1/2022 | Nomura | ................ | H01L 21/268 |
| 2022/0028799 A1* | 1/2022 | Komatsu | .................. | H05K 9/00 |
| 2022/0208626 A1* | 6/2022 | Komatsu | .............. | H01L 23/552 |
| 2023/0189429 A1* | 6/2023 | Nomura | ............. | H01L 23/3121 361/807 |
| 2024/0153703 A1* | 5/2024 | Oie | ......................... | H01G 4/33 |

\* cited by examiner

ELECTRONIC CIRCUIT MODULE

CROSS REFERENCE TO RELATED APPLICATION

This is a continuation of International Application No. PCT/JP2021/039525 filed on Oct. 26, 2021 which claims priority from Japanese Patent Application No. 2021-050561 filed on Mar. 24, 2021. The contents of these applications are incorporated herein by reference in their entireties.

BACKGROUND OF THE DISCLOSURE

Field of the Disclosure

The present disclosure relates to an electronic circuit module including a board and an electronic component mounted on the board.

Description of the Related Art

An electronic circuit module having at least one of an identification character and an identification mark is known. For example, in the semiconductor device disclosed in Patent Document 1, a mark is formed by cutting an aluminum plate bonded to a semiconductor element through heat dissipating grease.

The electronic circuit module is required to dissipate heat generated by the electronic component. For example, in a semiconductor device disclosed in Patent Document 1, heat generated by a semiconductor element is dissipated by heat dissipating grease and an aluminum plate.

Patent Document 1: JP H9-180973 A

BRIEF SUMMARY OF THE DISCLOSURE

In the semiconductor device disclosed in Patent Document 1, the mark is formed only by the unevenness of the aluminum plate. Therefore, there is a possibility that identifiability and visibility of the mark cannot be sufficiently obtained.

In addition, in the semiconductor device disclosed in Patent Document 1, an aluminum plate is stacked in addition to the heat dissipating grease. Therefore, the thickness of the semiconductor device increases.

Therefore, a possible benefit of the present disclosure is to solve the above problems, and to provide an electronic circuit module capable of dissipating heat generated by an electronic component while suppressing an increase in thickness, and capable of improving identifiability and visibility of an identification character and an identification mark as compared with the conventional technique.

In order to achieve the possible benefit, the present disclosure is configured as follows. An electronic circuit module according to an aspect of the present disclosure includes: a board; at least one electronic component mounted on a main surface of the board; and a sealing resin having a lower surface in contact with a main surface of the board, the sealing resin having an upper surface positioned on an opposite side from the board with respect to the electronic component to face in an opposite direction from the lower surface, the sealing resin configured to cover the electronic component, wherein an identification recess constituting at least one of an identification character and an identification mark when viewed from a thickness direction of the board is formed in an upper surface of the sealing resin, and wherein the identification recess is filled with a filler made of a material having a higher thermal conductivity than a material of the sealing resin.

According to the present disclosure, it is possible to dissipate heat generated by an electronic component while suppressing an increase in thickness, and to improve identifiability and visibility of an identification character and an identification mark as compared with the conventional technique.

DETAILED DESCRIPTION OF THE DISCLOSURE

An electronic circuit module according to an aspect of the present disclosure includes: a board; at least one electronic component mounted on a main surface of the board; and a sealing resin having a lower surface in contact with a main surface of the board, the sealing resin having an upper surface positioned on an opposite side from the board with respect to the electronic component to face in an opposite direction from the lower surface, the sealing resin configured to cover the electronic component, wherein an identification recess constituting at least one of an identification character and an identification mark when viewed from a thickness direction of the board is formed in an upper surface of the sealing resin, and wherein the identification recess is filled with a filler made of a material having a higher thermal conductivity than a material of the sealing resin.

According to this configuration, the filler filled in the identification recess is made of a material having a higher thermal conductivity than a material of the sealing resin. Therefore, the heat generated by the electronic component can be dissipated by the filler.

According to this configuration, the identification recess formed in the sealing resin is filled with a filler for dissipating heat generated by the electronic component. Therefore, it is possible to dissipate heat generated by the electronic component without additionally arranging a plate, a film, and the like for dissipating heat generated by the electronic component to be superposed on the sealing resin.

As a result, an increase in the thickness of the electronic circuit module can be suppressed.

According to this configuration, the identification recess constituting at least one of the identification character and the identification mark when viewed from the thickness direction of the board is filled with the filler. Therefore, the filler constitutes at least one of the identification character and the identification mark when viewed from the thickness direction of the board. That is, it is possible to cause the filler for dissipating heat generated by the electronic component to function as at least one of the identification character and the identification mark.

The filler is made of a material different from the sealing resin. Therefore, the color of the filler and the reflection of light on the upper surface of the filler are different from the color of the sealing resin and the reflection of light on the upper surface of the sealing resin. Therefore, the visibility and identifiability of the identification character and the identification mark formed by the filler can be improved more than the visibility and identifiability of the identification characters and the identification marks formed only by the steps of the recesses formed in the sealing resin.

In the electronic circuit module, the electronic component may include a heat generating component. At least a part of the filler may overlap at least a part of the heat generating component when viewed from the thickness direction.

According to this configuration, as compared with the configuration in which the filler does not overlap the heat generating components when viewed from the thickness direction, the heat dissipation of the heat generated by the heat generating components by the filler can be improved.

In the electronic circuit module, the sealing resin may be interposed between the filler and the heat generating component.

If the filler comes into contact with the heat generating components, the filler and the electrodes of the heat generating components may be short-circuited. According to this configuration, the sealing resin is interposed between the filler and the heat generating components. Therefore, a short circuit as described above can be prevented.

In the electronic circuit module, the heat generating component may be exposed to the identification recess. The filler may be in contact with the heat generating component.

According to this configuration, as compared with the configuration in which the filler is not in contact with the heat generating components, the heat dissipation of the heat generated by the heat generating components by the filler can be improved.

In the electronic circuit module, the heat generating component may include: a first component, and a second component shorter in the thickness direction than the first component. The identification recess may include: a first recess, and a second recess deeper in the thickness direction than the first recess. When viewed from the thickness direction, at least a part of the filler filled in the first recess may overlap at least a part of the first component. When viewed from the thickness direction, at least a part of the filler filled in the second recess may overlap at least a part of the second component.

According to this configuration, the identification recess can have a depth corresponding to the height of the heat generating component overlapping the identification recess when viewed from the thickness direction. Accordingly, it is possible to shorten the distance in the thickness direction of the board between the filler and the heat generating component. Therefore, the heat dissipation of the heat generated by the heat generating component can be improved.

According to this configuration, since the identification recess at the position overlapping the heat generating component having a low height when viewed from the thickness direction is deep, the amount of the filler to be filled in the identification recess increases. Accordingly, the heat dissipation of the heat generated by the heat generating component having a low height can be improved.

An electronic circuit module according to an aspect of the present disclosure may further include a conductive shield film configured to cover at least a region where the identification recess is formed in the upper surface of the sealing resin may be further provided.

According to this configuration, not only the filler but also the shield film can dissipate heat generated by the heat generating components.

In the electronic circuit module, in the upper surface of the sealing resin, a filling recess to be filled with the filler may be further formed in a part of a region where the identification recess is not formed.

According to this configuration, not only the filler to be filled in the identification recess but also the filler to be filled in the filling recess can dissipate heat generated by the heat generating components.

Hereinafter, embodiments of the present disclosure will be described with reference to the drawings. It should be noted that the present disclosure is not limited to the following embodiments. In addition, in the drawings, substantially the same members are denoted by the same reference numerals, whereby the description thereof will be omitted.

Hereinafter, for convenience of description, terms indicating directions such as "upper surface", "lower surface", and "side surface" are used, but these terms do not mean to limit a use state or the like of the electronic circuit module according to the present disclosure.

First Embodiment

Figure 1:
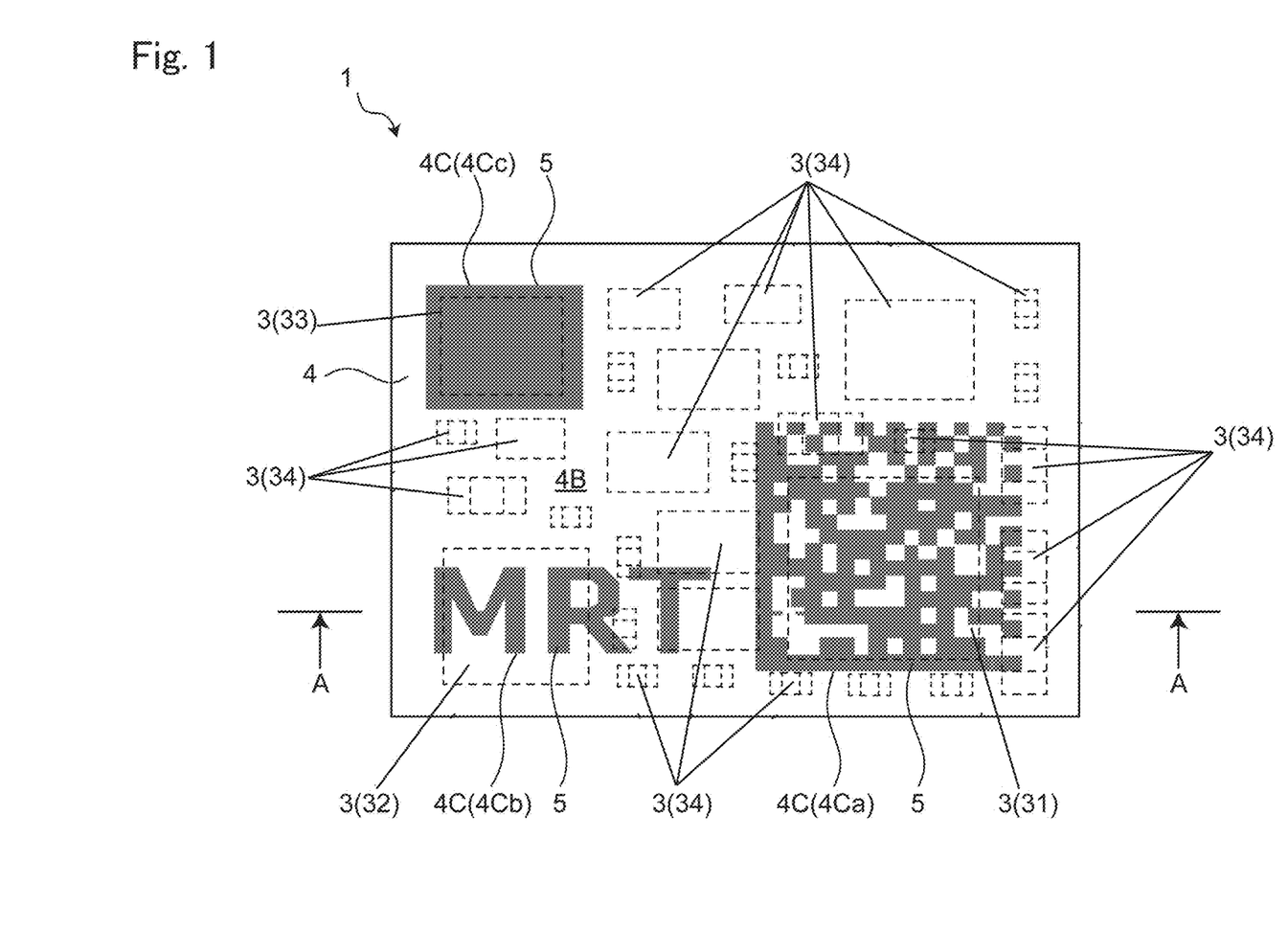
FIG. 1 is a plan view of an electronic circuit module according to a first embodiment of the present disclosure.
Figure 2:
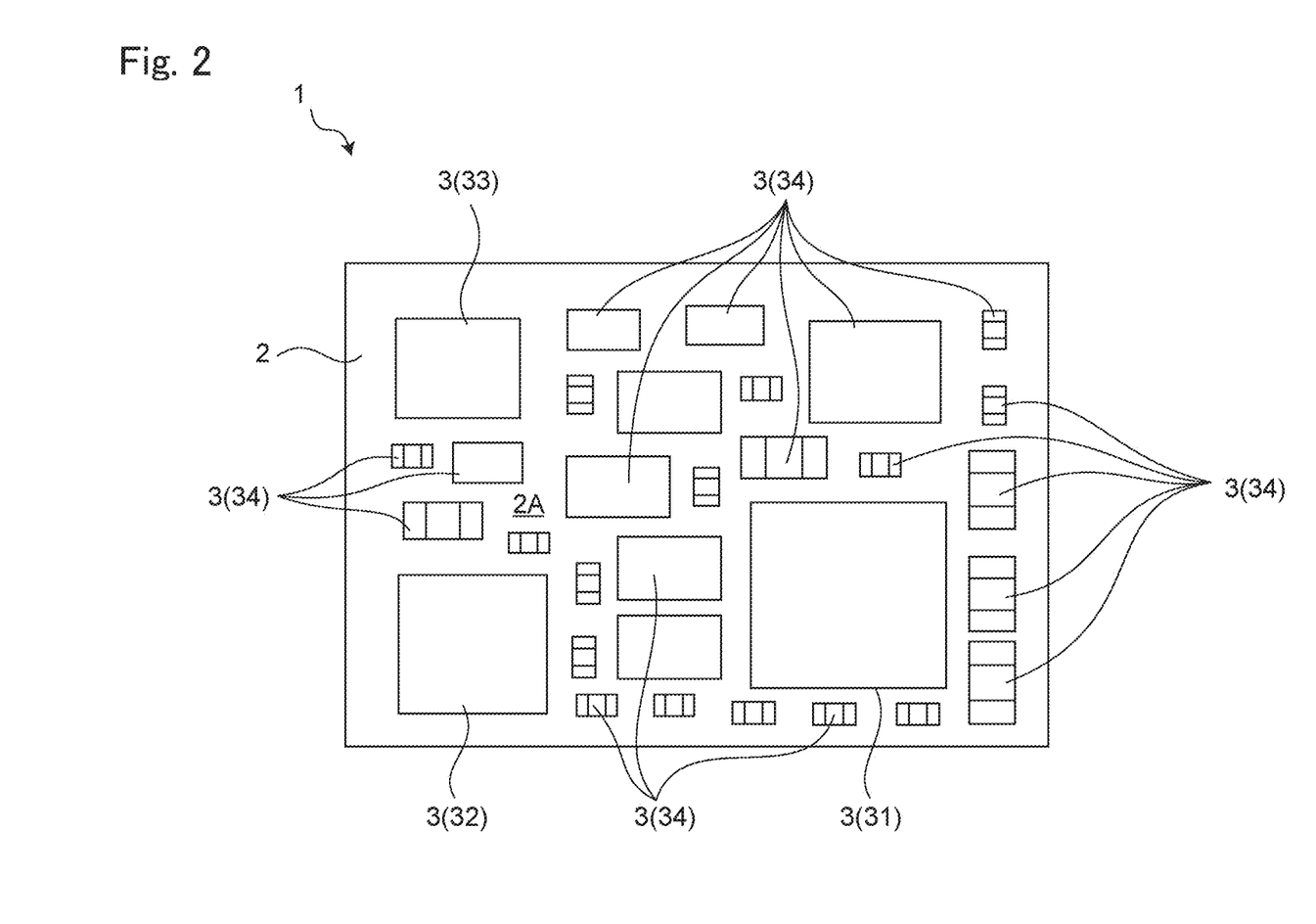
FIG. 2 is a plan view of an electronic circuit module in which a sealing resin is removed from the electronic circuit module in FIG. 1.
Figure 3:
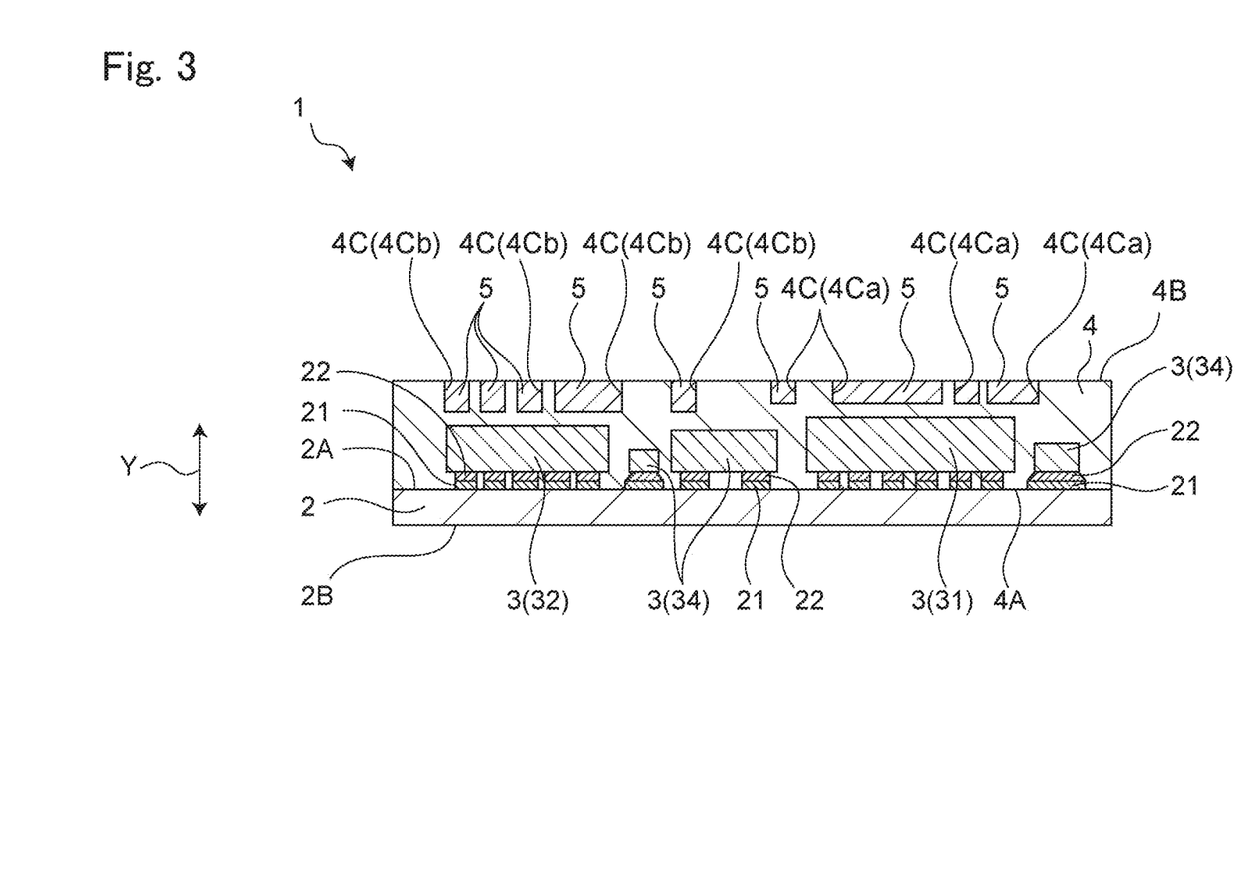
FIG. 3 is a cross-sectional view showing a cross section taken along line A-A in FIG. 1.

FIG. 1 is a plan view of an electronic circuit module according to a first embodiment of the present disclosure. FIG. 2 is a plan view of the electronic circuit module in which a sealing resin is removed from the electronic circuit module in FIG. 1. FIG. 3 is a cross-sectional view showing a cross section taken along line A-A in FIG. 1.

As shown in FIGS. 1 to 3, an electronic circuit module 1 includes a board 2, an electronic component 3, and a sealing resin 4. It should be noted that in FIG. 2, illustration of the sealing resin 4 is omitted.

As shown in FIG. 3, the board 2 has an upper surface 2A and a lower surface 2B being a back surface of the upper surface 2A. The upper surface 2A is an example of a main surface. The board 2 may be a single-layer board, a double-sided board, or a multilayer board. The board 2 is made of, for example, glass epoxy resin, low-temperature co-fired ceramic, high-temperature co-fired ceramic, or the like.

The upper surface 2A of the board 2 is provided with a mounting electrode 21. The mounting electrode 21 is made of, for example, a conductive material such as copper (Cu), silver (Ag), aluminum (Al), or a compound of these metals. The mounting electrode 21 may be plated with nickel (Ni)/gold (Au).

The electronic component 3 is mounted on the upper surface 2A of the board 2. The electronic component 3 is electrically connected to the mounting electrode 21 through the solder bump 22. As shown in FIG. 2, in the first embodiment, the electronic circuit module 1 includes 31 electronic components 3. That is, in the first embodiment, 31 electronic components 3 are mounted on the upper surface 2A of the board 2. It should be noted that the number of electronic components 3 included in the electronic circuit module 1 is not limited to 31. For example, the electronic circuit module 1 may include only one electronic component 3, or may include 40 electronic components 3. That is, the electronic circuit module 1 only needs to include at least one electronic component 3.

The electronic component 3 is, for example, a resistor, a capacitor, an inductor, a filter, an integrated circuit, or a semiconductor element such as a power amplifier. The filter is, for example, a surface acoustic wave filter, a bulk acoustic wave filter, or a ceramic LC filter. In the first embodiment, a plurality of types of electronic components 3 are provided.

The plurality of electronic components 3 include a heat generating component. In the first embodiment, among the 31 electronic components 3, the three electronic components 3 are heat generating components 31, 32, and 33. The heat generating components 31, 32, and 33 generate a larger calorific value than the other electronic components 3 mounted on the upper surface 2A of the board 2. The heat generating components 31, 32, and 33 are, for example, a power amplifier (PA), a low noise amplifier (LNA), a filter, or the like.

In the first embodiment, as shown in FIG. 3, the mounting height of the heat generating component 32 is lower than the mounting height of the heat generating component 31. In other words, the heat generating component 32 is shorter than the heat generating component 31 in the thickness direction Y of the board 2. The heat generating component 31 is an example of a first component. The heat generating component 32 is an example of a second component.

The sealing resin 4 is provided on the upper surface 2A of the board 2. The sealing resin 4 is made of, for example, an epoxy resin or the like. The sealing resin 4 may contain, for example, a filler such as silica filler or alumina.

The sealing resin 4 covers the electronic component 3 mounted on the upper surface 2A of the board 2. In other words, the electronic component 3 is embedded in the sealing resin 4. The sealing resin 4 has a lower surface 4A and an upper surface 4B. The lower surface 4A is in contact with the upper surface 2A of the board 2. The upper surface 4B is positioned on the opposite side from the board 2 with respect to the electronic component 3. The upper surface 4B faces in the opposite direction from the lower surface 4A.

As shown in FIG. 1, three recesses 4C (recesses 4Ca, 4Cb, and 4Cc) are formed in the upper surface 4B of the sealing resin 4. In the following description, the recesses 4Ca, 4Cb, and 4Cc are collectively referred to as a recess 4C. Each of the recesses 4C constitutes any one of an identification character and an identification mark when viewed from the thickness direction Y of the board 2. The identification character is, for example, hiragana, kanji, alphabet, or a combination thereof. The identification mark is, for example, a numeral, a symbol, a dotted recognition code, a barcode, a two-dimensional code, a logo, a figure, or a combination thereof.

In the first embodiment, as shown in FIG. 1, a recess 4Cb formed in a shape of "MRT" constitutes an identification character. In addition, each of the recess 4Cb formed in the shape of a two-dimensional code and the recess 4Cc formed in the shape of a rectangle constitutes an identification mark. It should be noted that the rectangular shape of the recess 4Cc described above functions as a direction mark formed, for example, to prevent the electronic circuit module 1 from being arranged in a wrong direction. The recess 4C is an example of the identification recess.

As shown in FIG. 3, the recess 4Cb is deeper than the recess 4Ca in the thickness direction Y of the board 2. The recess 4Ca is an example of a first recess. The recess 4Cb is an example of a second recess. It should be noted that the depth of the recess 4Cc may be the same as that of the recess 4Ca, the same as that of the recess 4Cb, or a depth different from that of any of the recesses 4Ca and 4Cb.

The recess 4C does not reach the electronic component 3 positioned immediately below the recess 4C. That is, the depth of the recess 4C is smaller than the distance in the thickness direction Y of the board 2 between the electronic component 3 positioned immediately below the recess 4C and the upper surface 4B of the sealing resin 4.

In the first embodiment, the depth of the recess 4Ca is 20 to 30 μm, and the depth of the recess 4Cb is 40 to 50 μm. The depth of the recess 4C is not limited to the depth described above.

As shown in FIG. 1, the recess 4C overlaps the heat generating components 31, 32, and 33 when viewed from the thickness direction Y of the board 2. In the first embodiment, when viewed from the thickness direction Y of the board 2, a part of the recess 4Ca overlaps a part of the heat generating component 31. In addition, when viewed from the thickness direction Y of the board 2, a part of the recess 4Cb overlaps a part of the heat generating component 32. In addition, when viewed from the thickness direction Y of the board 2, a part of the recess 4Cc overlaps the entire heat generating component 33 (see FIG. 2).

It should be noted that the mode of overlap between the recess 4C and the heat generating components 31, 32, and 33 when viewed from the thickness direction Y of the board 2 is not limited to the mode described above. That is, at least a part of the recess 4C only needs to overlap at least a part of the heat generating components 31, 32, and 33 when viewed from the thickness direction Y of the board 2. For example, at least a part of the recess 4Ca may overlap at least a part of the heat generating component 31 when viewed from the thickness direction Y of the board 2. In addition, for example, when viewed from the thickness direction Y of the board 2, the recess 4Ca may overlap both a part of the heat generating component 31 and a part of the heat generating component 32. In addition, for example, each of the recesses 4Ca and 4Cb may overlap the heat generating component 31 when viewed from the thickness direction Y of the board 2.

The recess 4C is formed, for example, by removing the sealing resin 4 with a laser beam.

As shown in FIGS. 1 and 3, the recess 4C is filled with a filler 5. The filler 5 is made of a material having higher thermal conductivity than the sealing resin 4. In the first embodiment, the filler 5 is made of silver. By a silver paste being poured into the recess 4C, the filler 5 is filled in the recess 4C. The filler 5 is not limited to silver. For example, the filler 5 may be copper, aluminum, or the like. In addition, for example, the filler 5 may be a resin containing a metal material.

As described above, the recess 4C does not reach the electronic component 3 positioned immediately below the recess 4C. That is, the sealing resin 4 is interposed between the filler 5 filled in the recess 4C and the electronic component 3 overlapping the recess 4C when viewed from the thickness direction Y of the board 2. In the first embodiment, as shown in FIG. 3, the sealing resin 4 is interposed between the filler 5 filled in the recess 4Ca and the heat generating component 31. In addition, the sealing resin 4 is interposed between the filler 5 filled in the recess 4Cb and the heat generating component 32. In addition, although not shown, the sealing resin 4 is interposed between the filler 5 filled in the recess 4Cc and the heat generating component 33 (see FIG. 2).

As described above, the recess 4C overlaps the heat generating components 31, 32, and 33 when viewed from the thickness direction Y of the board 2. That is, the filler filled in the recess 4C overlaps the heat generating components 31, 32, and 33 when viewed from the thickness direction Y of the board 2. In the first embodiment, when viewed from the thickness direction Y of the board 2, a part of the filler 5 filled in the recess 4Ca overlaps a part of the heat generating component 31. In addition, when viewed from the thickness direction Y of the board 2, a part of the filler 5 filled in the recess 4Cb overlaps a part of the heat generating component 32. In addition, when viewed from the thickness direction Y of the board 2, a part of the filler 5 filled in the recess 4Cc overlaps the entire heat generating component 33 (see FIG. 2).

It should be noted that as described above, the mode of overlap between the recess 4C and the heat generating components 31, 32, and 33 when viewed from the thickness direction Y of the board 2 is not limited to the mode shown in FIGS. 1 to 3. Therefore, the mode of overlap between the filler 5 filled in the recess 4C and the heat generating components 31, 32, and 33 when viewed from the thickness direction Y of the board 2 is not limited to the above-described mode, either. That is, at least a part of the filler 5 filled in the recess 4C only needs to overlap at least a part of the heat generating components 31, 32, and 33 when viewed from the thickness direction Y of the board 2.

For example, in contrast to the above, when viewed from the thickness direction Y of the board 2, the whole of the filler 5 filled in the recess 4Cc may overlap a part of the heat generating component 33. In addition, for example, when viewed from the thickness direction Y of the board 2, the outer edge of the recess 4Cc and the outer edge of the heat generating component 33 may coincide with each other. In this case, when viewed from the thickness direction Y of the board 2, the whole of the filler 5 filled in the recess 4Cc overlaps the whole of the heat generating component 33.

In addition, for example, at least a part of the filler 5 filled in the recess 4Ca may overlap at least a part of the heat generating component 31 when viewed from the thickness direction Y of the board 2. In addition, for example, when viewed from the thickness direction Y of the board 2, the filler 5 filled in the recess 4Ca may overlap both a part of the heat generating component 31 and a part of the heat generating component 32. In addition, for example, each of the filler 5 filled in the recess 4Ca and the filler 5 filled in the recess 4Cb may overlap the heat generating component 31 when viewed from the thickness direction Y of the board 2.

The color and brightness of the filler 5 may be color and brightness different from the color and brightness of the sealing resin 4. For example, the color of one of the filler 5 and the sealing resin 4 may be a complementary color to that of the other of the filler 5 and the sealing resin 4. In addition, for example, one of the filler 5 and the sealing resin 4 may have a bright color, and the other of the filler 5 and the sealing resin 4 may have a dark color. Accordingly, it is possible to enhance the identifiability and visibility of the identification character and the identification mark formed by the filler 5. In the first embodiment, the filler 5 has white tones, and the sealing resin 4 has black tones.

According to the first embodiment, the filler 5 filled in the recess 4C is made of a material having a thermal conductivity higher than that of the sealing resin 4. Therefore, the heat generated by the electronic component 3 can be dissipated by the filler 5.

According to the first embodiment, the filler 5 for dissipating heat generated by the electronic component 3 is filled in the recess 4C formed in the sealing resin 4. Therefore, it is possible to dissipate heat generated by the electronic component 3 without additionally arranging a plate, a film, and the like for dissipating heat generated by the electronic component 3 to be superposed on the sealing resin 4. As a result, an increase in the thickness of the electronic circuit module 1 can be suppressed.

According to the first embodiment, the recess 4C constituting at least one of the identification character and the identification mark when viewed from the thickness direction Y of the board 2 is filled with the filler 5. Accordingly, the filler 5 constitutes at least one of the identification character and the identification mark when viewed from the thickness direction Y of the board 2. That is, it is possible to cause the filler 5 for dissipating heat generated by the electronic component 3 to function as at least one of the identification character and the identification mark.

The filler 5 is made of a material different from the sealing resin 4. Therefore, the color of the filler 5 and the reflection of light on the upper surface of the filler 5 are different from the color of the sealing resin 4 and the reflection of light on the upper surface 4B of the sealing resin 4. Therefore, the visibility and identifiability of the identification character and the identification mark formed by the filler 5 can be improved more than the visibility and identifiability of the identification characters and the identification marks formed only by the steps of the recesses formed in the sealing resin 4.

According to the first embodiment, as compared with the configuration in which the filler 5 does not overlap the heat generating components 31, 32, and 33 when viewed from the thickness direction Y of the board 2, the heat dissipation of the heat generated by the heat generating components 31, 32, and 33 by the filler 5 can be improved.

If the filler 5 comes into contact with the heat generating components 31, 32, and 33, the filler 5 and the electrodes of the heat generating components 31, 32, and 33 may be short-circuited. According to the first embodiment, the sealing resin 4 is interposed between the filler 5 and the heat generating components 31, 32, and 33. Therefore, a short circuit as described above can be prevented.

According to the first embodiment, the respective depths of the recesses 4Ca, 4Cb, and 4Cc can be set to a depth corresponding to the heights of the heat generating components 31, 32, and 33 overlapping the respective recesses 4Ca, 4Cb, and 4Cc when viewed from the thickness direction Y of the board 2. In the first embodiment, the depth of the recess 4Cb positioned directly above the heat generating component 32 having a lower mounting height than the heat generating component 31 is larger than the depth of the recess 4Ca positioned directly above the heat generating component 31. Accordingly, it is possible to shorten the distance in the thickness direction Y of the board 2 between the filler 5 to be filled in the recess 4Cb and the heat generating component 32. As a result, the heat dissipation of the heat generated by the heat generating component 32 can be improved.

According to the first embodiment, since the recess 4Cb at the position overlapping the heat generating component 32 having a low height when viewed from the thickness direction Y of the board 2 is deep, the amount of the filler 5 to be filled in the recess 4Cb increases. Accordingly, the heat dissipation of the heat generated by the heat generating component 32 can be improved.

When the board 2 is a double-sided board or a multilayer board, an external electrode (not shown) may be provided on the lower surface 2B of the board 2. In this case, the electronic circuit module 1 is mounted on the mother board through an external electrode, for example. The external electrode may be electrically connected to the mounting electrode 21. In this case, power is supplied or a signal is transmitted to the electronic component 3 through the external electrode. In addition, the external electrode may be connected to an external ground potential (for example, the ground potential of the mother board). In this case, the electronic component 3 can be grounded.

When the board 2 is a multilayer board, an internal electrode may be provided inside the board 2. The external electrode and the internal electrode may be plated as with the mounting electrode 21.

The electronic component 3 may be mounted not on the upper surface 2A of the board 2 but on the lower surface 2B of the board 2. In this case, the lower surface 2B corresponds to the main surface. When the board 2 is a double-sided board or a multilayer board, the electronic component 3 may be mounted on both the upper surface 2A and the lower surface 2B of the board 2. In this case, the upper surface 2A and the lower surface 2B correspond to main surfaces.

The sealing resin 4 may be provided on the lower surface 2B of the board 2, or may be provided on both the upper surface 2A and the lower surface 2B of the board 2. In this case, the recess 4C may be formed in the sealing resin 4 provided on the lower surface 2B of the board 2. In addition, in this case, the filler 5 may be filled in the recess 4C formed in the sealing resin 4 provided on the lower surface 2B of the board 2.

In the first embodiment, the electronic circuit module 1 has three recesses 4C, but the electronic circuit module 1 only needs to have at least one recess 4C.

In the first embodiment, among the three recesses 4Ca, 4Cb, and 4Cc, the recess 4Cb constitutes an identification character, and the recesses 4Ca and 4Cc constitute an identification mark, but the present disclosure is not limited thereto. For example, all of the recesses 4Ca, 4Cb, and 4Cc may constitute an identification character, or all of the recesses 4Ca, 4Cb, and 4Cc may constitute an identification mark. In addition, for example, in contrast to the first embodiment, the recess 4Cb may constitute an identification mark, and the recesses 4Ca and 4Cc may constitute an identification character.

In the first embodiment, each of the three recesses 4Ca, 4Cb, and 4Cc is formed by only any one of an identification character and an identification mark. However, one recess 4C, for example, the recess 4Ca may include both an identification character and an identification mark. That is, one recess 4C constitutes at least one of the identification character and the identification mark.

Figure 8:
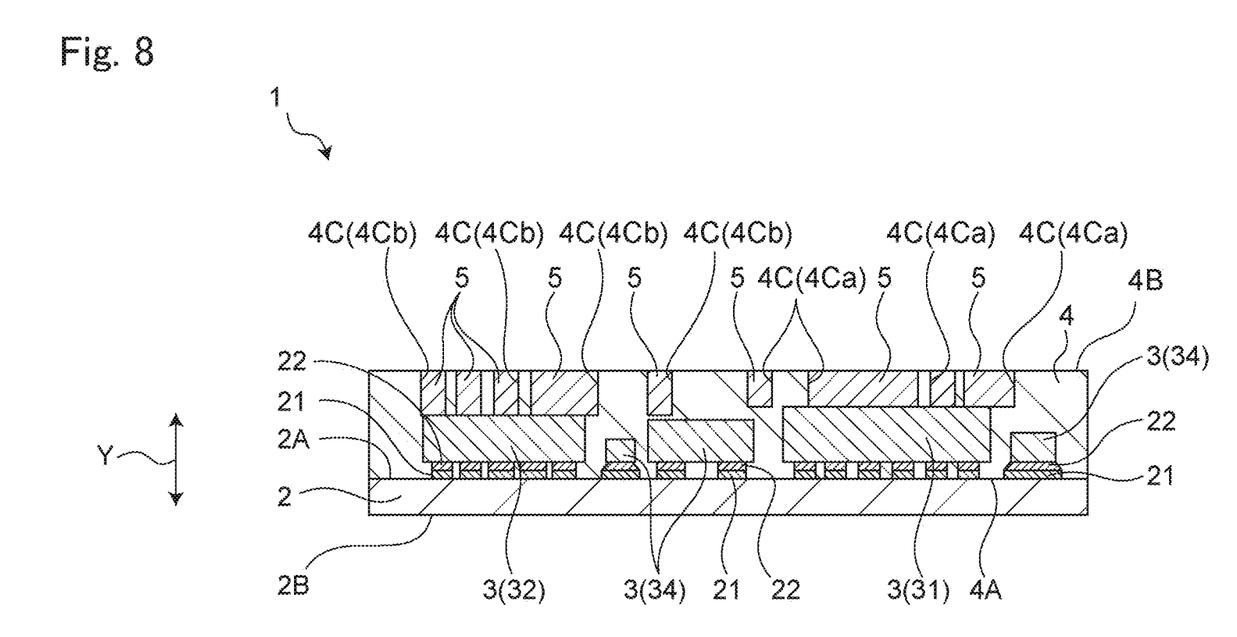
FIG. 8 is a cross-sectional view corresponding to the A-A cross section in FIG. 1 in a modification of the electronic circuit module according to the first embodiment of the present disclosure.

FIG. 8 is a cross-sectional view corresponding to the A-A cross section in FIG. 1 in a modification of the electronic circuit module according to the first embodiment of the present disclosure. In the first embodiment, the sealing resin 4 is interposed between the recess 4C and the electronic component 3 when viewed from the thickness direction Y of the board 2. However, as shown in FIG. 8, the sealing resin 4 does not need to be interposed between the recess 4C and the electronic component 3 when viewed from the thickness direction Y of the board 2. That is, the recess 4C may reach the electronic component 3 by penetrating the sealing resin 4 in the thickness direction Y of the board 2. In other words, the electronic component 3 may be exposed to the recess 4C. In this case, the filler 5 to be filled in the recess 4C is in contact with the electronic component 3.

In FIG. 8, the sealing resin 4 is not interposed between the recess 4C and the heat generating components 31 and 32. In addition, although not shown, the sealing resin 4 is not interposed between the recess 4C and the heat generating component 33, either. That is, the filler 5 to be filled in the recess 4C is in contact with all the heat generating components 31, 32, and 33. However, the filler 5 may be in contact with only some among the heat generating components 31, 32, and 33. For example, the filler 5 may be in contact with the heat generating component 31 but not in contact with the heat generating components 32 and 33.

According to the configuration shown in FIG. 8, as compared with the configuration in which the filler 5 is not in contact with the heat generating components 31, 32, and 33, the heat dissipation of the heat generated by the heat generating components 31, 32, and 33 by the filler 5 can be improved.

In the first embodiment, the heat generating component 32 is shorter in the thickness direction Y of the board 2 than the heat generating component 31. However, the height of each of the electronic components 3 including the heat generating components 31 and 32 is not limited to the height shown in FIG. 3 and the like. For example, the heat generating component 31 may have the same height as the heat generating component 32.

In the first embodiment, the recess 4Cb is deeper than the recess 4Ca in the thickness direction Y of the board 2. However, the depth of each of the recesses 4Ca, 4Cb, and 4Cc is not limited to the depth described above. For example, the recesses 4Ca, 4Cb, and 4Cc may have the same depth.

Second Embodiment

Figure 4:
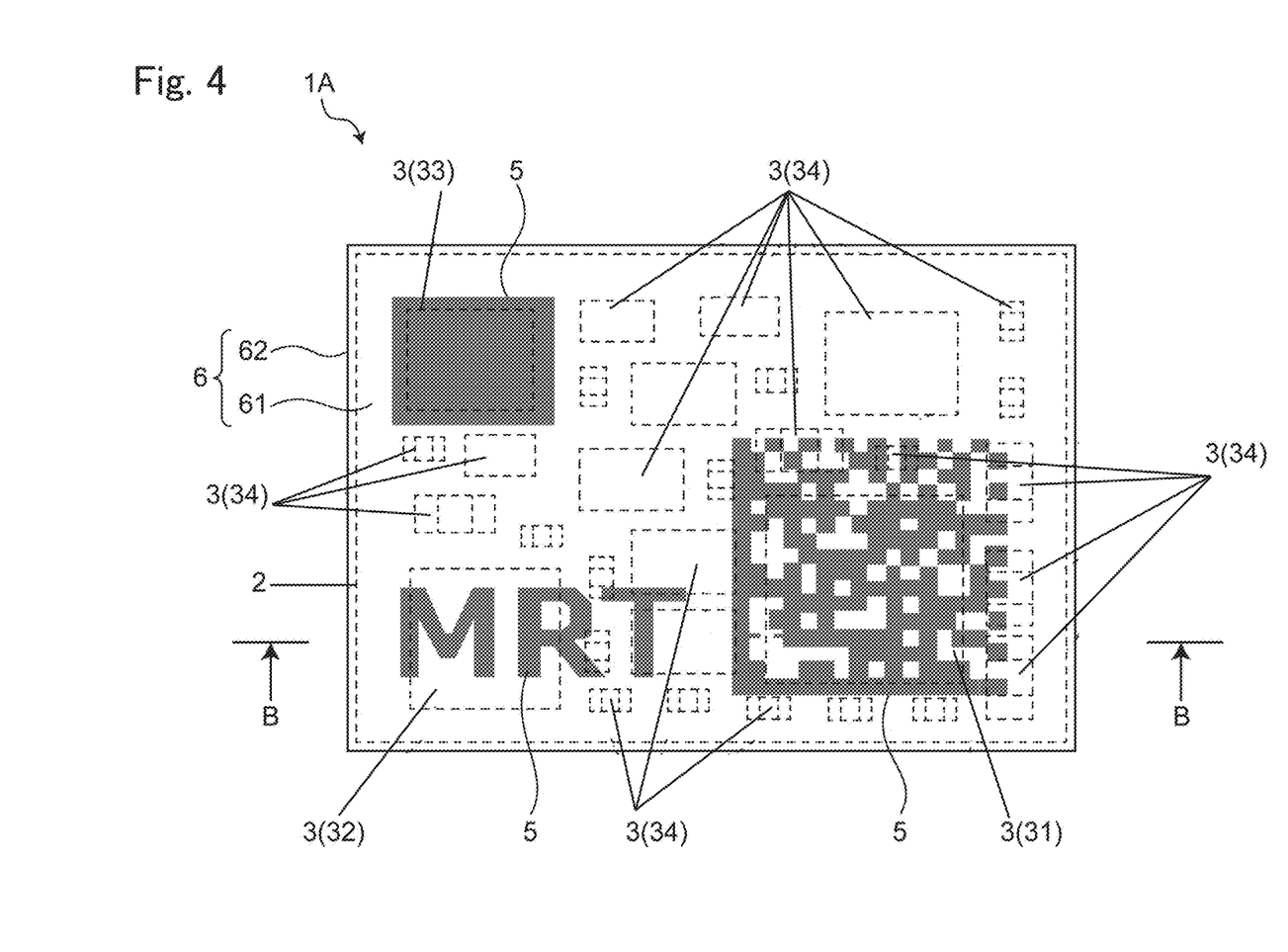
FIG. 4 is a plan view of an electronic circuit module according to a second embodiment of the present disclosure.
Figure 5:
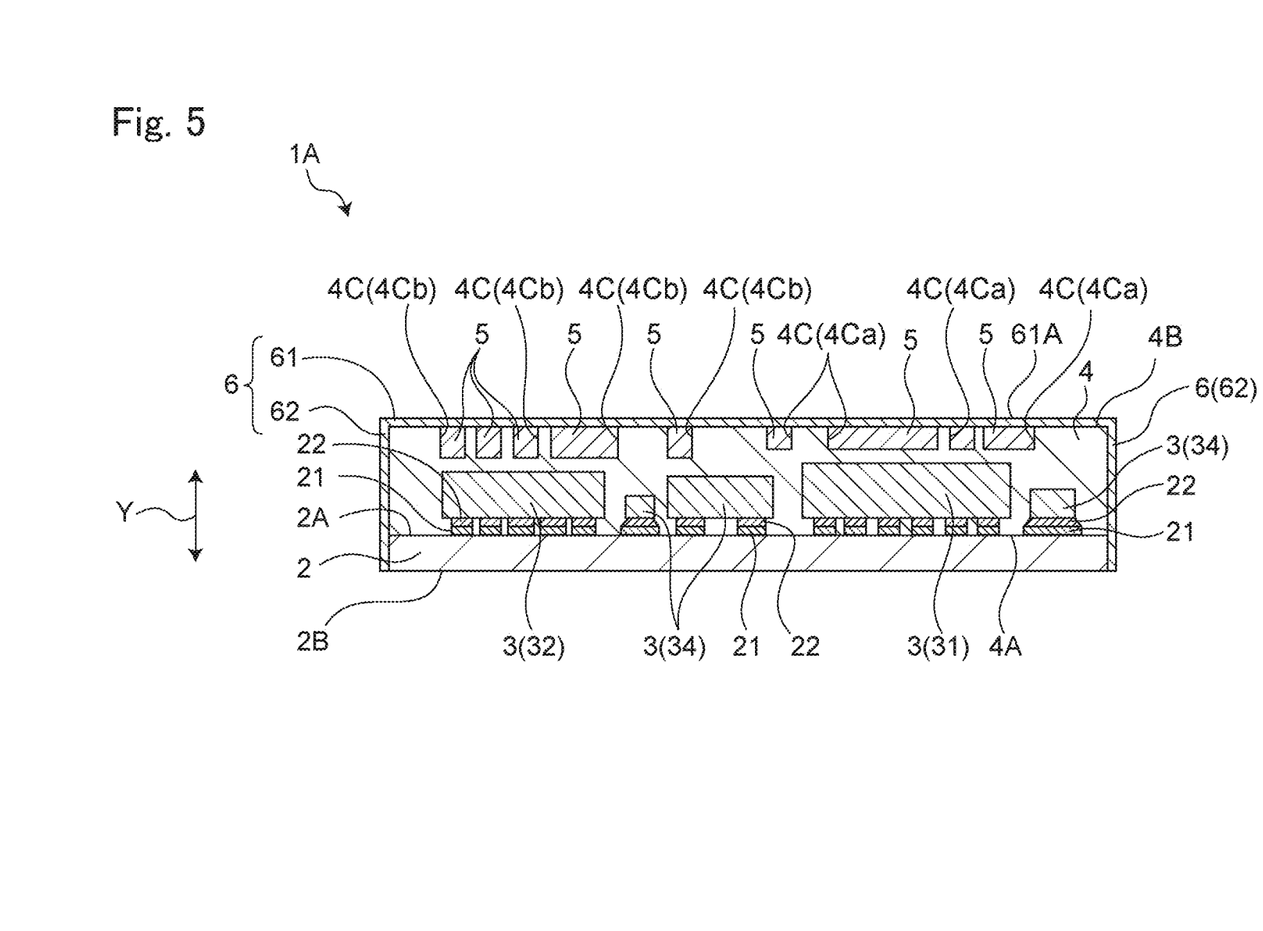
FIG. 5 is a cross-sectional view showing a cross section taken along line B-B in FIG. 4.

FIG. 4 is a plan view of an electronic circuit module according to a second embodiment of the present disclosure. FIG. 5 is a cross-sectional view showing a cross section taken along line B-B in FIG. 4. The electronic circuit module 1A according to the second embodiment is different from the electronic circuit module 1 according to the first embodiment in that the electronic circuit module 1A according to the second embodiment includes a shield film 6. Hereinafter, differences from the first embodiment will be described. Common points with the electronic circuit module 1 of the first embodiment are denoted by the same reference numerals, and description thereof will be omitted in principle and described as necessary. The same applies to each embodiment described below.

As shown in FIGS. 4 and 5, the shield film 6 covers the upper part and side part of the board 2 and sealing resin 4. The shield film 6 has conductivity. Typically, at least a part of the shield film 6 is made of metal. In the second embodiment, the shield film 6 is made of a conductive member such as copper. A part of the shield film 6 may be made of a conductive member. For example, in the shield film 6, a material having conductivity may be contained in another material such as a resin.

Figure 9:
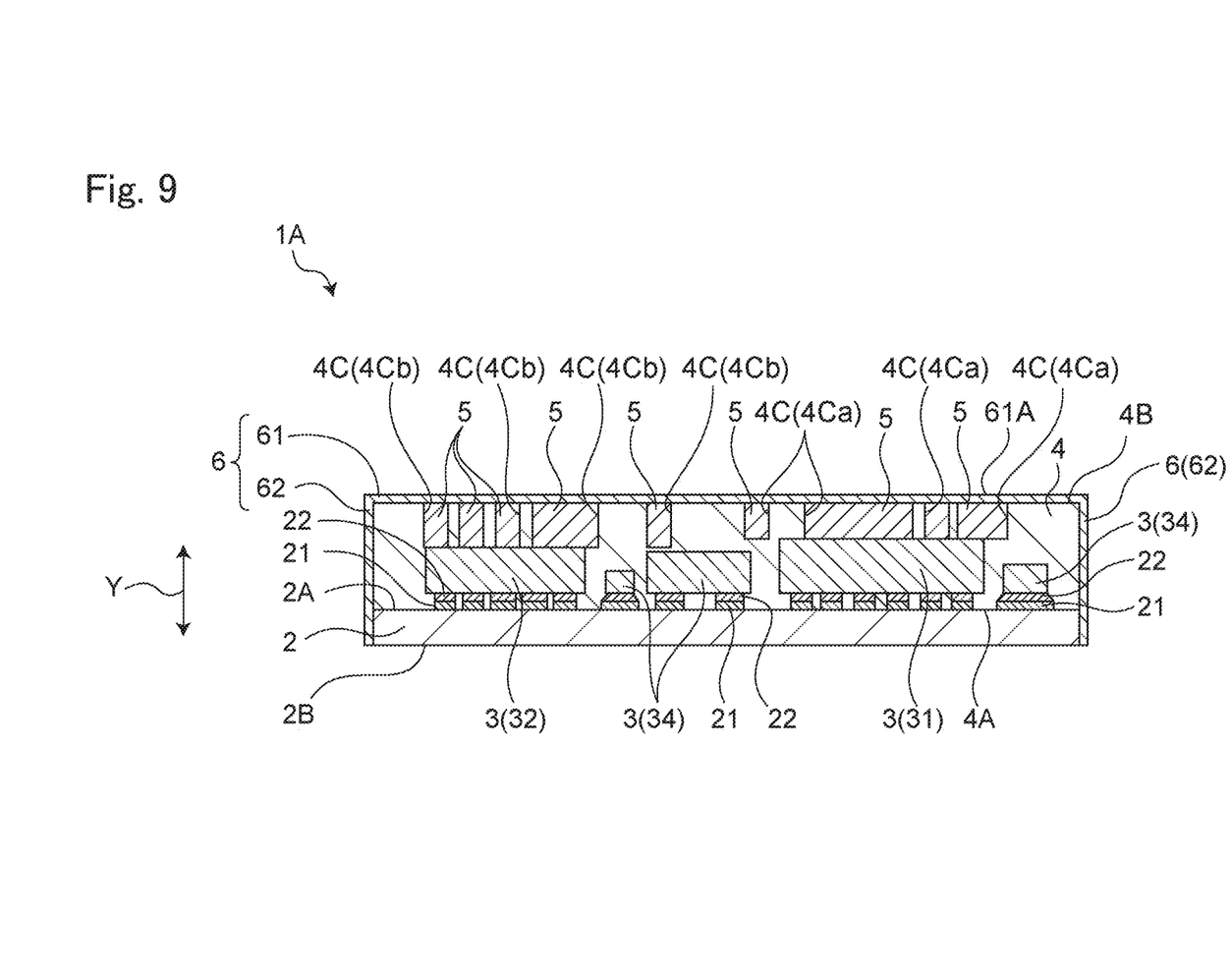
FIG. 9 is a cross-sectional view corresponding to the B-B cross section in FIG. 4 in a modification of the electronic circuit module according to the second embodiment of the present disclosure.

It should be noted that even in the configuration in which the filler 5 is in contact with the heat generating components 31, 32, and 33 (the configuration shown in FIG. 8), the shield film 6 may be provided as shown in FIG. 9. FIG. 9 is a cross-sectional view corresponding to the B-B cross section in FIG. 4 in a modification of the electronic circuit module according to the second embodiment of the present disclosure.

The shield film 6 is formed by, for example, a sputtering method or a vapor deposition method. The film thickness of the shield film 6 is, for example, 2 μm or more and less than 5 μm.

The shield film 6 may have a multilayer structure. For example, the shield film 6 may include an adhesion layer in contact with the sealing resin 4, a conductive layer in contact with the adhesion layer and made of a metal having high conductivity, and a rust prevention layer in contact with the conductive layer and preventing oxidation or corrosion of the conductive layer. The conductive layer has a function of shielding an electromagnetic wave, and is made of, for example, copper (Cu), silver (Ag), aluminum (Al), or the like. The adhesion layer is provided to enhance adhesion between the sealing resin 4 and the conductive layer, and is made of, for example, titanium (Ti), chromium (Cr), stainless steel (SUS), or the like.

The shield film 6 shields an electromagnetic wave from the outside of the electronic circuit module 1. Therefore, the electronic component 3 is less likely to be affected by an electromagnetic wave from the outside. In addition, the shield film 6 shields the electromagnetic wave radiated by the electronic component 3. Therefore, the electromagnetic wave radiated from the electronic component 3 is less likely to affect other components outside the electronic circuit module 1.

As described above, at least a part of the shield film 6 is made of metal. Therefore, the shield film 6 dissipates heat generated by the heat generating components 31, 32, and 33.

The shield film 6 may be connected to an external ground potential (for example, the ground potential of the mother board).

The shield film 60 includes an upper film 61 and a side film 62. The upper film 61 is laminated on the upper surface 4B of the sealing resin 4. The side film 62 extends from the peripheral edge of the upper film 61. The side film 62 is laminated on the side surfaces of the sealing resin 4 and the board 2.

The upper film 61 is in contact with the filler 5 filled in the recess 4C from above. Accordingly, the filler 5 is electrically connected to the shield film 6. As a result, the filler 5 can be grounded through the shield film 6.

It should be noted that the mounting electrode 21 may be electrically connected to the shield film 6. In this case, the mounting electrode 21 can be grounded through the shield film 6. In addition, when the electronic circuit module 1A includes an external electrode and an internal electrode, the external electrode and the internal electrode may be electrically connected to the shield film 6.

In the second embodiment, the filler 5 is covered with the shield film 6 from above. Therefore, the filler 5 cannot be directly visually recognized. However, as described below, it is possible to recognize an identification character and an identification mark formed by the filler 5.

The filler 5 and the sealing resin 4 are made of different materials. Therefore, the configuration of the upper surface 4B of the sealing resin 4 is different from the configuration of the upper surface of the filler 5. For example, while the upper surface 4B of the sealing resin 4 has many irregularities, the upper surface of the filler 5 made of silver, that is, the upper surface of the filler 5 made of metal is smoother than the upper surface 4B of the sealing resin 4. Here, even when the sealing resin 4 is polished together with the filler 5 after the recess 4C is filled with the filler 5, and the upper surface 4B of the sealing resin 4 and the upper surface of the filler 5 are flush with each other, the difference in the configuration of the surface described above occurs.

Therefore, when the shield film 6 is laminated on the upper surface 4B of the sealing resin 4 and the upper surface of the filler 5, the configurations of the upper surface 61A (see FIG. 5) of the upper film 61 are different between a portion in contact with the sealing resin 4 in the upper film 61 of the shield film 6 and a portion in contact with the filler 5 in the upper film 61 of the shield film 6. Accordingly, when light strikes the upper film 61 of the shield film 6, in a region in contact with the upper surface 4B of the sealing resin 4 in the upper film 61, the light is reflected so as to be different from a region in contact with the upper surface of the filler 5 in the upper film 61. As a result, the identification character and the identification mark formed by the filler 5 can be visually recognized and identified through the upper film 61.

It should be noted that when there is a step between the filler 5 filled in the recess 4C and the upper surface 4B of the sealing resin 4, the identification character and the identification mark formed by the filler 5 can be visually recognized and identified also with the step.

According to the second embodiment, not only the filler 5 but also the shield film 6 can dissipate heat generated by the heat generating components 31, 32, and 33.

In the second embodiment, the shield film 6 is provided so as to cover the upper part and side part of the board 2 and sealing resin 4, but the present disclosure is not limited thereto. In the upper surface 4B of the sealing resin 4, the shield film 6 only needs to cover at least the region where the recess 4C is formed. For example, the shield film 6 may include only the upper film 61, without including the side film 62.

Third Embodiment

Figure 6:
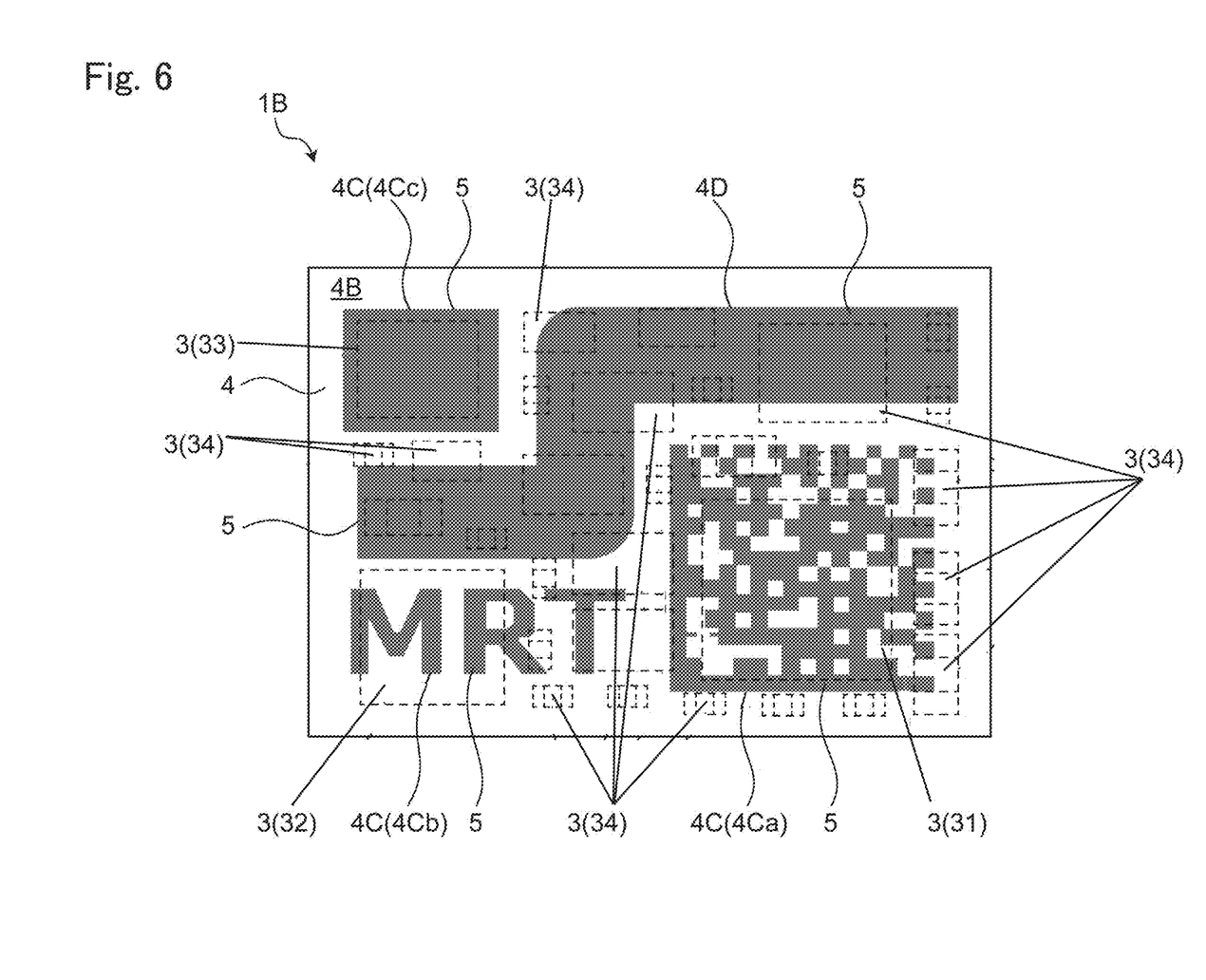
FIG. 6 is a plan view of an electronic circuit module according to a third embodiment of the present disclosure.

FIG. 6 is a plan view of an electronic circuit module 1B according to a third embodiment of the present disclosure. The electronic circuit module 1B according to the third embodiment is different from the electronic circuit module 1 according to the first embodiment in that the electronic circuit module 1B according to the third embodiment includes a recess 4D. Hereinafter, differences from the first embodiment will be described.

As shown in FIG. 6, in the electronic circuit module 1B, one recess 4D is further formed in addition to the three recesses 4C in the upper surface 4B of the sealing resin 4. The recess 4D is filled with the filler 5 as with the recess 4C. The recess 4D is an example of the filling recess.

In the upper surface 4B of the sealing resin 4, the recess 4D is formed in a region where the recess 4C is not formed.

In the third embodiment, when viewed from the thickness direction Y of the board 2, the recess 4D does not overlap the heat generating components 31, 32, and 33, but overlaps some of the electronic components 3 other than the heat generating components 31, 32, and 33. However, at least a part of the recess 4D may overlap at least a part of the heat generating components 31, 32, and 33 when viewed from the thickness direction Y of the board 2. In addition, when viewed from the thickness direction Y of the board 2, the recess 4D does not need to overlap the electronic components 3 other than the heat generating components 31, 32, and 33.

In the third embodiment, when viewed from the thickness direction Y of the board 2, the recess 4D and the filler 5 filled in the recess 4D do not constitute any of an identification character and an identification mark. However, when viewed from the thickness direction Y of the board 2, the recess 4D and the filler 5 filled in the recess 4D may constitute at least one of an identification character and an identification mark. In this case, the recess 4D corresponds to an identification recess that does not overlap the heat generating components 31, 32, and 33 when viewed from the thickness direction Y of the board 2.

In the third embodiment, the electronic circuit module 1B includes one recess 4D. However, the recesses 4D may be formed at a plurality of places on the upper surface 4B of the sealing resin 4. That is, the electronic circuit module 1B may include a plurality of recesses 4D.

The depth of the recess 4D may be larger than that of the recess 4C, smaller than that of the recess 4C, or the same as that of the recess 4C.

According to the third embodiment, not only the filler 5 to be filled in the recess 4C but also the filler 5 to be filled in the recess 4D can dissipate heat generated by the heat generating components 31, 32, and 33.

Fourth Embodiment

Figure 7:
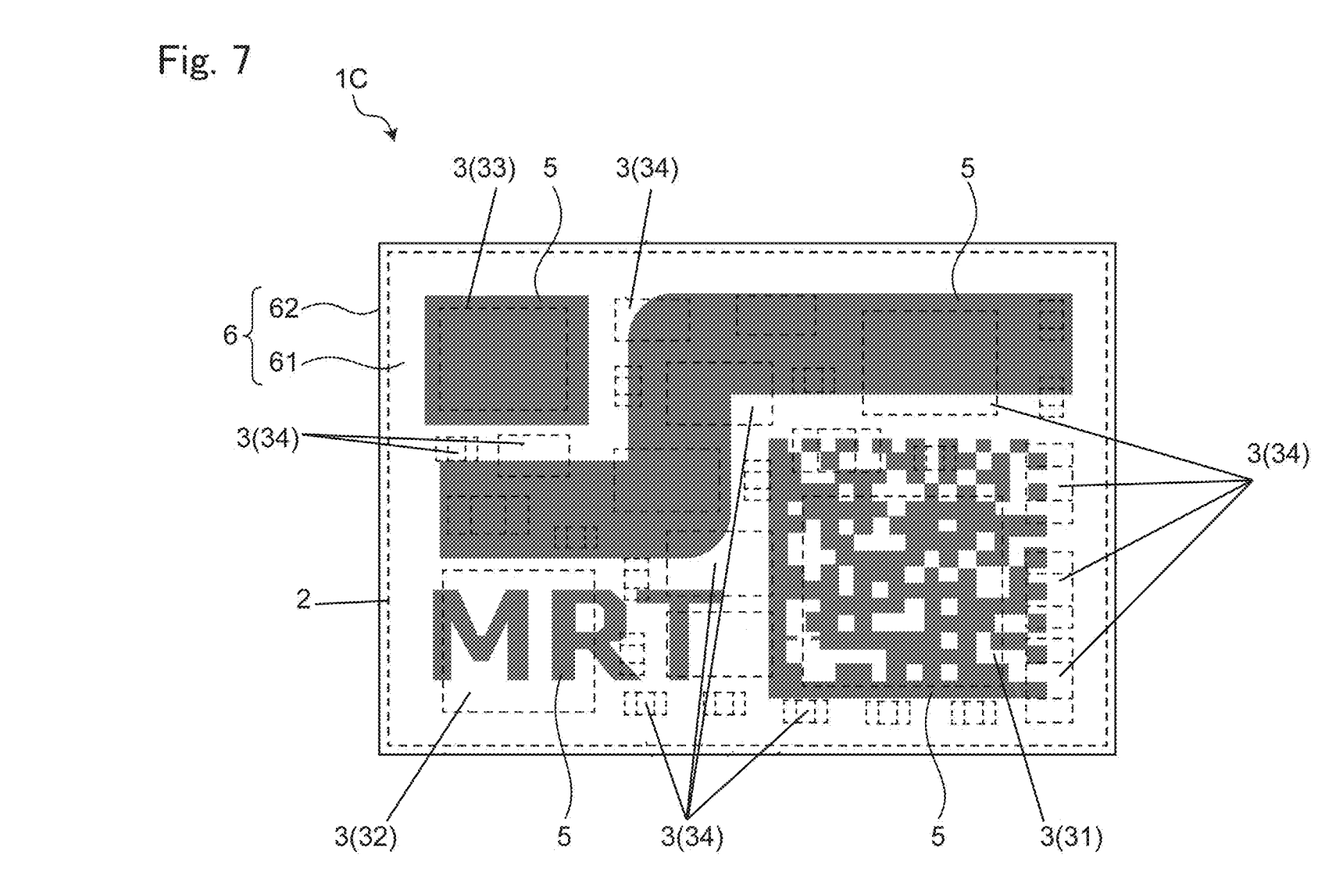
FIG. 7 is a plan view of an electronic circuit module according to a fourth embodiment of the present disclosure.

FIG. 7 is a plan view of an electronic circuit module 1C according to a fourth embodiment of the present disclosure. The electronic circuit module 1C according to the fourth embodiment is different from the electronic circuit module 1B according to the third embodiment in that the electronic circuit module 1C according to the fourth embodiment includes a shield film 6. Hereinafter, differences from the third embodiment will be described.

The difference between the electronic circuit module 1C according to the fourth embodiment and the electronic circuit module 1B according to the third embodiment is similar to the difference between the electronic circuit module 1A according to the second embodiment and the electronic circuit module 1 according to the first embodiment. That is, the electronic circuit module 1C is obtained by adding the shield film 6 having the same configuration as that of the electronic circuit module 1A to the electronic circuit module 1B. That is, in the electronic circuit module 1C, the upper part and side part of the board 2 and sealing resin 4 of the electronic circuit module 1B are covered with the shield film 6.

According to the fourth embodiment, not only the filler 5 but also the shield film 6 can dissipate heat generated by the heat generating components 31, 32, and 33.

It should be noted that appropriately combining any embodiment among the various embodiments allows the effect of each embodiment to be produced.

The present disclosure has been sufficiently described in connection with the preferable embodiment with reference to the drawings as appropriate, but various modifications and corrections are apparent for those skilled in the art. It should be understood that as long as such modifications and corrections do not depart from the scope of the present disclosure by the attached claims, they are included therein.

1 electronic circuit module
2 board
2A upper surface (main surface)
3 electronic component
31 heat generating component (first component)
32 heat generating component (second component)
33 heat generating component
4 sealing resin
4A lower surface
4B upper surface
4C recess (identification recess)
4D recess (filling recess)
4Ca recess (first recess)
4Cb recess (second recess)
5 filler
6 shield film
Y thickness direction

What is claimed is:

1. An electronic circuit module comprising:
a board;
at least one electronic component mounted on a main surface of the board; and
a sealing resin having a lower surface in contact with the main surface of the board, the sealing resin having an upper surface positioned on an opposite side from the board with respect to the electronic component to face in an opposite direction from the lower surface, the sealing resin covering the electronic component, wherein
an identification recess constituting at least one of an identification character and an identification mark when viewed from a thickness direction of the board is provided in the upper surface of the sealing resin,
wherein the identification recess in the upper surface of the sealing resin is filled with a filler comprising a material having a higher thermal conductivity than a material of the sealing resin, and
wherein the entire upper surface of the sealing resin except for the identification recess is not filled with the filler.

2. The electronic circuit module of claim 1, wherein
the electronic component comprises a heat generating component, and wherein
at least a part of the filler overlaps at least a part of the heat generating component when viewed from the thickness direction.

3. The electronic circuit module of claim 2, wherein
the sealing resin is interposed between the filler and the heat generating component.

4. The electronic circuit module of claim 3, wherein
the heat generating component comprises:
a first component, and
a second component shorter in the thickness direction than the first component, wherein
the identification recess comprises:
a first recess, and
a second recess deeper in the thickness direction than the first recess, wherein
when viewed from the thickness direction, at least a part of the filler filled in the first recess overlaps at least a part of the first component, and wherein
when viewed from the thickness direction, at least a part of the filler filled in the second recess overlaps at least a part of the second component.

5. The electronic circuit module of claim 3, further comprising:
a conductive shield film covering at least a region where the identification recess is provided in the upper surface of the sealing resin.

6. The electronic circuit module of claim 3, wherein,
in the upper surface of the sealing resin, a filling recess to be filled with the filler is further provided in a part of a region where the identification recess is not provided.

7. The electronic circuit module of claim 2, wherein
the heat generating component is exposed to the identification recess, and wherein
the filler is in contact with the heat generating component.

8. The electronic circuit module of claim 7, wherein
the heat generating component comprises:
a first component, and
a second component shorter in the thickness direction than the first component, wherein
the identification recess comprises:
a first recess, and
a second recess deeper in the thickness direction than the first recess, wherein
when viewed from the thickness direction, at least a part of the filler filled in the first recess overlaps at least a part of the first component, and wherein
when viewed from the thickness direction, at least a part of the filler filled in the second recess overlaps at least a part of the second component.

9. The electronic circuit module of claim 7, further comprising:
a conductive shield film covering at least a region where the identification recess is provided in the upper surface of the sealing resin.

10. The electronic circuit module of claim 7, wherein,
in the upper surface of the sealing resin, a filling recess to be filled with the filler is further provided in a part of a region where the identification recess is not provided.

11. The electronic circuit module of claim 2, wherein
the heat generating component comprises:
a first component, and
a second component shorter in the thickness direction than the first component, wherein
the identification recess comprises:
a first recess, and
a second recess deeper in the thickness direction than the first recess, wherein
when viewed from the thickness direction, at least a part of the filler filled in the first recess overlaps at least a part of the first component, and wherein
when viewed from the thickness direction, at least a part of the filler filled in the second recess overlaps at least a part of the second component.

12. The electronic circuit module of claim 11, further comprising:
a conductive shield film covering at least a region where the identification recess is provided in the upper surface of the sealing resin.

13. The electronic circuit module of claim 11, wherein,
in the upper surface of the sealing resin, a filling recess to be filled with the filler is further provided in a part of a region where the identification recess is not provided.

14. The electronic circuit module of claim 2, further comprising:
a conductive shield film covering at least a region where the identification recess is provided in the upper surface of the sealing resin.

15. The electronic circuit module of claim 2, wherein,
in the upper surface of the sealing resin, a filling recess to be filled with the filler is further provided in a part of a region where the identification recess is not provided.

16. The electronic circuit module of claim 1, further comprising:
a conductive shield film covering at least a region where the identification recess is provided in the upper surface of the sealing resin.

17. The electronic circuit module of claim 16, wherein,
in the upper surface of the sealing resin, a filling recess to be filled with the filler is further provided in a part of a region where the identification recess is not provided.

18. The electronic circuit module of claim 1, wherein,
in the upper surface of the sealing resin, a filling recess to be filled with the filler is further provided in a part of a region where the identification recess is not provided.

* * * * *